United States Patent
Miyao et al.

(12) 
(10) Patent No.: US 6,652,934 B1
(45) Date of Patent: Nov. 25, 2003

(54) SILICA GLASS CRUCIBLE AND METHOD OF FABRICATING THEREOF

(75) Inventors: Atsuro Miyao, Yamagata (JP); Kiyoaki Misu, Yamagata (JP); Kazuhiko Takariki, Yamagata (JP); Izumi Kawakami, Yamagata (JP); Kouzou Kitano, Yamagata (JP); Naoyuki Obata, Yamagata (JP); Hiroshi Yamaguchi, Kanagawa (JP); Fusaki Kimura, Yamagata (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 134 days.

(21) Appl. No.: 09/584,478

(22) Filed: Jun. 1, 2000

(30) Foreign Application Priority Data

Jun. 1, 1999 (JP) .......................... P. 11-154295

(51) Int. Cl.$^7$ .................. B29D 22/00; B29D 23/00; B32B 1/08
(52) U.S. Cl. ........................................ 428/34.4
(58) Field of Search .............. 428/34.4, 34.5; 501/12, 53, 54; 65/900

(56) References Cited

U.S. PATENT DOCUMENTS

| | | | | |
|---|---|---|---|---|
| 4,747,863 A | * | 5/1988 | Clasen et al. | 264/628 |
| 4,828,593 A | * | 5/1989 | Morishita et al. | 65/134.2 |
| 5,141,786 A | * | 8/1992 | Shimizu et al. | 428/34.4 |
| 5,145,510 A | * | 9/1992 | Saito et al. | 65/18.1 |
| 5,174,801 A | * | 12/1992 | Matsumura et al. | 65/18.1 |
| 6,263,704 B1 | * | 7/2001 | Tomita et al. | 65/30.13 |

FOREIGN PATENT DOCUMENTS

| | | |
|---|---|---|
| JP | 1-157426 | 6/1989 |
| JP | 1-157427 | 6/1989 |
| JP | 5-124889 | 5/1993 |
| JP | 7-330358 | 12/1995 |

* cited by examiner

Primary Examiner—Kenneth R. Rice
(74) Attorney, Agent, or Firm—Foley & Lardner

(57) ABSTRACT

A silica glass crucible 1 having α of 0.05 or less over a thickness of 0.5 mm or more from the inner surface of the silica glass crucible, α being obtained by dividing the fluorescent intensity integrated over a wavelength range of 4,000 cm$^{-1}$ and 4,100 cm$^{-1}$ by the fluorescent intensity integrated at a wavelength of 800 cm$^{-1}$ where an SiO peak appears as determined by subjecting a section of the thickness of the silica glass crucible to laser Raman spectroscopy involving excitation by laser beam of 514 nm, and an OH group concentration of 100 ppm or less over the entire periphery beyond a thickness of at least 1.0 mm from the inner surface of the silica glass crucible. A process for the preparation of a silica glass crucible for withdrawing single silicon crystal which comprises supplying helium gas or argon gas at least into the interior of the crucible-shaped molded product, and then initiating or continuing arc fusion before the termination of which the supply of argon gas is suspended or the supplied amount of argon gas is reduced and the supply of hydrogen gas is initiated.

14 Claims, 15 Drawing Sheets

SILICA GLASS CRUCIBLE AND METHOD OF FABRICATING THEREOF

BACKGROUND OF THE INVENTION

1. Field of the Invention

The present invention relates to a silica glass crucible and a method of fabricating thereof. More particularly, the present invention relates to a silica glass crucible capable of enhancing the yield in conversion to single crystal during the withdrawal of single silicon crystal and a process for the production thereof.

2. Description of the Related Art

Single silicon crystal to be incorporated in the substrate of semiconductor device is usually prepared by Czochralski process (Cz process). In accordance with CZ process, a silica glass crucible is loaded with polycrystalline silicon as a starting material. The silicon is then circumferentially heated so that it is fused. A hanging seed crystal is allowed to come in contact with the silicon melt, and then withdrawn therefrom.

The conventional silica glass crucible is produced by vacuum fusion or the like. When the temperature of the silica glass crucible is raised during the withdrawal of single crystal, bubbles are produced in the transparent layer, causing the deformation of the silica glass crucible. Further, the silicon melt erodes the surface of the silica glass crucible. The erosion causes bubbles in the transparent layer (inner layer) of the silica glass crucible to be exposed at the interface with the silicon melt, rendering the conversion to single crystal unstable. As a result, the yield in the conversion to single crystal is lowered. Bubbles produced in the transparent layer are mainly composed of oxygen. Portions containing much impurities or structural water nucleate for bubbles. Surrounding oxygen diffuses into the bubbles thus formed to cause the bubbles to grow.

In recent years, various preparation processes have been studied for preparing a silica glass crucible with its transparent layer free of bubbles. However, none of these proposals allow total elimination of bubbles. Even if these proposed processes allow remarkable reduction of the production of bubbles in the transparent layer as compared with the conventional silica glass crucible, the yield in conversion to single silicon crystal which is required to have a high quality cannot necessarily be sufficiently enhanced to a satisfactory extent.

A crucible preparation process has heretofore been commonly practiced which comprises fusing a quartz powder as a starting material in a mold under reduced pressure to form a transparent layer on the inner side of a crucible. In this preparation process, however, bubbles are left in the transparent layer in the vicinity of the inner surface of the crucible. When a single crystal is withdrawn from the crucible prepared by such a preparation process, bubbles are expanded in the transparent layer. As the transparent layer on the inner side of the crucible is dissolved away, bubbles enter into the silicon melt. Thus, bubbles are taken into the single silicon crystal thus withdrawn from the crucible. The bubbles cause crystal dislocation resulting in dislocation (crystal defect), lowering the percent conversion to single crystal.

Various preparation processes have been studied for preparing a silica glass crucible with its transparent layer free of bubbles.

For example, as a process for the preparation of a silica glass crucible having less bubbles in the transparent layer there is described in JP-A-1-157426 (The term "JP-A" as used herein means an "unexamined published Japanese patent application") a process which comprises supplying a quartz powder as a starting material into an air-permeable mold to form a crucible-shaped molded product, reducing the pressure in the system, and then fusing the material with helium gas, argon gas or a mixture thereof being supplied thereinto to prepare a crucible. In accordance with the preparation process, a crucible can be prepared with its transparent layer having somewhat less content of bubbles. However, when a single crystal is withdrawn from this silica glass crucible, bubbles are expanded as in the silica glass crucible prepared by fusing a quartz powder as a starting material at the atmospheric pressure. The bubbles are then taken into the single silicon crystal thus withdrawn, causing crystal dislocation resulting in dislocation and hence making it impossible to provide sufficient enhancement of percent conversion to single crystal.

Further, JP-A-1-157427 discloses a process which comprises supplying a quartz powder as a starting material into an air-permeable mold to form a crucible-shaped molded product, reducing the pressure in the system, and then supplying hydrogen gas, helium gas or a mixture into the system from the initiation of fusion to prepare a crucible. In accordance with this preparation process, hydrogen gas and helium gas diffuse into the transparent layer of the crucible, making it for other gases to diffuse into the transparent layer. Thus, the gases in the bubbles formed during fusion diffuse away out of the silica glass. However, when a crucible is prepared by supplying helium gas from the initiation of fusion until the termination of fusion, the same problems as in the foregoing preparation processes occur. When a crucible is prepared by supplying hydrogen gas or a mixture of hydrogen gas and helium gas from the initiation of fusion until the termination of fusion, the expansion of bubbles during the withdrawal of single crystal can be inhibited, but the OH concentration in the silica glass crucible rises to lower the viscosity of the silica glass, occasionally causing the deformation of the crucible. This disadvantage becomes remarkable particularly with large-sized silica glass crucibles intended for prolonged use.

Further, JP-A-7-330358 discloses a process for the preparation of a silica glass crucible which comprises cooling the inner surface of a silica glass crucible with a hydrogen atmosphere after the termination arc fusion.

In accordance with this preparation process, the production and growth of microbubbles can be inhibited. However, since the supply of hydrogen is effected after the termination of arc fusion, it is made difficult to reduce the amount of bubbles which are not a little left in the transparent layer of the crucible and prevent bubbles in the outer opaque layer from being expanded.

Moreover, JP-A-5-124889 discloses a process which comprises subjecting a crucible formed by arc fusion (which has been allowed to cool to room temperature) to heat treatment at a temperature of from 300° C. to 1,200° C. in a hydrogen atmosphere. In accordance with this preparation process, the problem of expansion of bubbles in the crucible can be solved. However, the inner surface of the crucible is eroded considerably partially during the withdrawal of single crystal, resulting in the drop of percent conversion to single crystal.

It has been desired to provide a silica glass crucible which allows the withdrawal of a single crystal at a high percent conversion to single crystal without taking bubbles into the single silicon crystal thus withdrawn and causing dislocation, can be used over an extended period of time and can be obtained in a large size and a process for the preparation thereof in a high yield.

SUMMARY OF THE INVENTION

The present invention has been worked out under the foregoing circumstances. An object of the present invention is to provide a silica glass crucible which allows the withdrawal of a single crystal at a high percent conversion to single crystal without taking bubbles into the single silicon crystal thus withdrawn and causing dislocation, can be used over an extended period of time and can be obtained in a large size and a process for the preparation thereof in a high yield.

A first implementation of the present worked out to accomplish the foregoing object is a silica glass crucible having a of 0.05 or less over a thickness of 0.5 mm or more from the inner surface of the silica glass crucible, α being obtained by dividing the fluorescent intensity integrated over a wavelength range of 4,000 $cm^{-1}$ and 4,100 $cm^{-1}$ by the fluorescent intensity integrated at a wavelength of 800 $cm^{-1}$ where an SiO peak appears as determined by subjecting a section of the thickness of the silica glass crucible to laser Raman spectroscopy involving excitation by laser beam of 514 nm, and a hydroxyl group concentration of 100 ppm or less over the entire periphery beyond a thickness of at least 1.0 mm from the inner surface of the silica glass crucible.

A second implementation of the present invention is a silica glass crucible according to the first implementation, substantially free of micro-cracking on the inner surface thereof.

A third implementation of the present invention is a process for the preparation of a silica glass crucible for withdrawing single silicon crystal which comprises supplying a quartz powder as a starting material into a rotating mold to form a crucible-shaped molded product which is then arc-fused, characterized in that the supply of helium gas or argon gas at least into the interior of said crucible-shaped molded product is followed by the initiation or continuation of arc fusion before the termination of which the supply of argon gas is suspended or the supplied amount of argon gas is reduced and the supply of hydrogen gas is initiated.

A fourth implementation of present invention is a process for the preparation of a silica glass crucible for withdrawing single silicon crystal according to the third implementation, wherein the reduction of pressure is effected on the peripheral side of the crucible-shaped molded product via the mold before or at the same time with said arc fusion or after the fusion of the inner surface of the crucible-shaped molded product by the arc fusion.

A fifth implementation of the invention is a process for the preparation of a silica glass crucible for withdrawing single silicon crystal according to the fourth implementation, wherein the reduction of pressure is lessened or suspended before the initiation of the supply of hydrogen gas.

The sixth implementation of the present invention is a process for the preparation of a silica glass crucible for withdrawing single silicon crystal according to the fourth implementation, wherein the supply of hydrogen gas is initiated at latest 5 minutes before the termination of arc fusion.

The seventh implementation of the present invention is a process for the preparation of a silica glass crucible for withdrawing single silicon crystal according to the sixth implementation, wherein the supply of hydrogen gas is initiated after the elapse of time corresponding to 40% of the total arc fusion time from the initiation of arc fusion.

DESCRIPTION OF THE PREFERRED EMBODIMENT

Embodiments of implication of the silica glass crucible according to the present invention and processes for the preparation thereof will be described hereinafter in connection with the attached drawings.

Figure 1:
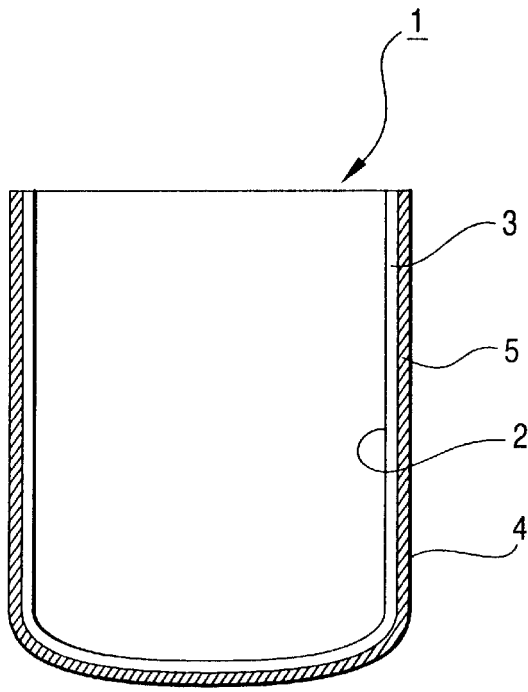
FIG. 1 is a diagram illustrating the silica glass crucible according to the present invention.

FIG. 1 is a diagram illustrating a silica glass crucible 1 according to the present invention. The silica glass crucible 1 is formed by two layers, i.e., a transparent layer (inner layer) 3 provided on the inner surface 2 side thereof and an opaque layer (outer layer) 5 provided on the outer periphery 4 side thereof.

Figure 2:
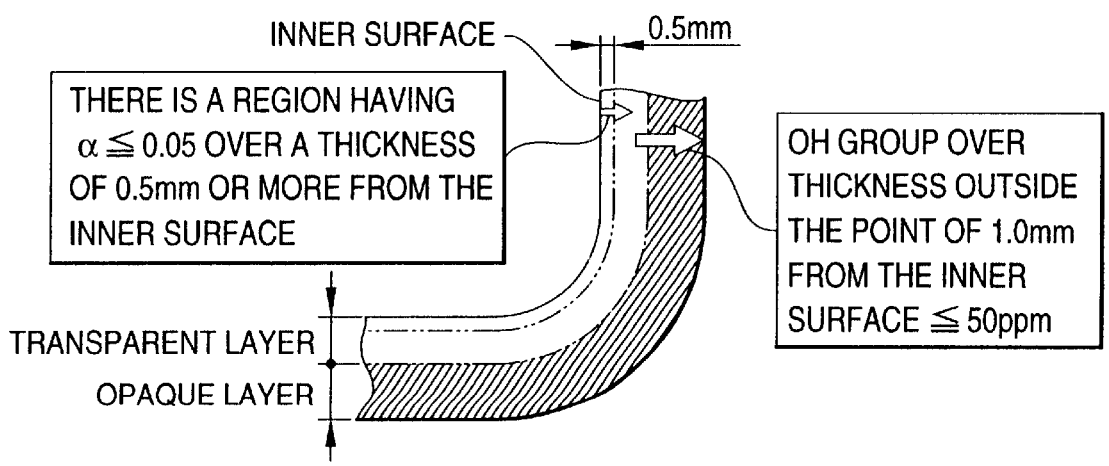
FIG. 2 is an enlarged view of the portion A of FIG. 1.

As shown in FIG. 2, which is an enlarged view of a part of FIG. 1, the silica glass crucible 1 has α of 0.05 or less over a thickness of 0.5 mm or more from the inner surface of the silica glass crucible, a being obtained by dividing the fluorescent intensity integrated over a wavelength range of 4,000 $cm^{-1}$ and 4,100 $cm^{-1}$ by the fluorescent intensity integrated at a wavelength of 800 $cm^{-1}$ where an SiO peak appears as determined by subjecting a section of the thickness of the silica glass crucible to laser Raman spectroscopy involving excitation by laser beam of 514 nm, and an OH group concentration of 100 ppm or less over the entire periphery beyond a thickness of at least 1.0 mm from the inner surface of the silica glass crucible.

In the foregoing arrangement, the silica glass crucible 1 is not liable to the production or expansion of bubbles in the transparent layer 3 during the withdrawal of single crystal by CZ process. Further, the silica glass crucible 1 undergoes no deformation during the withdrawal of single crystal. As a result, a high percent conversion to single crystal can be accomplished.

When the requirement is not satisfied that the value of α is 0.05 or less over a thickness of 0.5 mm or more from the inner surface 2 of the silica glass crucible 1, the production or expansion of bubbles cannot be prevented. Further, when the requirement is not satisfied that the OH group concentration is 100 ppm or less over the entire periphery beyond a thickness of at least 1.0 mm from the inner surface of the silica glass crucible, the deformation of the entire silica glass crucible 1 cannot be inhibited.

In order to prevent the production of bubbles in the transparent layer during the withdrawal of single silicon crystal from the silica glass crucible, it is necessary that impurities or structural water which can nucleate be removed or oxygen excessively dissolved in the silica glass or unstably bonded to Si atom be removed.

Referring to the former solution, it is difficult to remove impurities or structural water completely. Referring to the latter solution, the production of bubbles can be inhibited by forming, re-heating or fusing the transparent layer in hydrogen.

The effect of hydrogen on the inhibition of production of bubbles can be explained as follows. Firstly, by removing oxygen from the atmosphere, oxygen excessively dissolved in the silica glass can be excluded from the silica glass. Secondly, unstable oxygen is taken into and fixed in the glass network structure or stabilized as OH group. It is thought that hydrogen acts to convert oxygen in the atmosphere to water, thereby lowering the oxygen concentration in the atmosphere, as well as to convert unstable oxygen in the silica glass to OH group so that it is fixed.

The foregoing conjecture can be grounded on the following knowledge.

From the knowledge that excess oxygen containing unstable oxygen emits red fluorescence having a peak at 650 nm, the inventors found that infrared rays emitted by irradiating the silica glass with laser beam can be detected to judge the percent removal of excess oxygen, i.e., if hydrogen can be diffused or dissolved in the silica glass thoroughly enough to remove unstable oxygen.

The fluorescent intensity can be detected by laser Raman spectroscopy using laser beam of 514 nm, which can be measured by laser Raman spectroscopy. The Raman spectrum thus developed has a peak having a central frequency of about 4,000 $cm^{-1}$. In some detail, a columnar specimen including the transparent layer is cut out of the silica glass crucible. The specimen is then mirror-polished. The specimen thus mirror-polished is then irradiated with laser beam. The resulting fluorescence is then measured at the front side of the specimen. The fluorescence peaks are distributed over a range of from 2000 $cm^{-1}$ to 6,000 $cm^{-1}$. Thus, measurement may be effect at any point in this frequency range. However, when measurement is effected at the short wavelength side, the fluorescent peaks overlap SiO peaks, and the measurement is subject to the effect of yellow fluorescence. Accordingly, measurement is preferably effected at the long wavelength side.

Measurement may be effected at one point. However, integral intensity can be determined over a certain range to raise the sensitivity of measurement. Accordingly, the area intensity of red fluorescence is calculated in the frequency range of from 4,000 $cm^{-1}$ to 4,100 $cm^{-1}$, where there is little interference and a sufficient intensity can be obtained. SiO network peak appearing at 800 $cm^{-1}$ is measured as a reference peak. The area intensity of SiO network peak is calculated over a frequency range of from 700 $cm^{-1}$ to 900 $cm^{-1}$. The fluorescence intensity is defined by the ratio of the area intensity of red fluorescence to the area intensity of reference peak. It was found that when the intensity ratio is 0.05 or less as evaluated above, the production of bubbles can be inhibited.

The zero level in the measurements of fluorescence intensity indicates the case where the specimen is not irradiated with laser beam. The spectroscope used must be capable of thoroughly removing Rayleigh scattering developed by incident laser beam. The reason why the measurement range is from 4,000 $cm^{-1}$ to 4,100 $cm^{-1}$ is that the fluorescence intensity becomes maximum within this range. Another reason is that it is desired to eliminate the effect of yellow fluorescence at the low frequency side taking into account the interference by OH peak appearing in the range of from 3,500 $cm^{-1}$, to 3,800 $cm^{-1}$ and $H_2$ peak appearing in the range of from 4,100 $cm^{-1}$ to 4,200 $cm^{-1}$. SiO peak is cut by a linear base line between 700 $cm^{-1}$ and 900 $cm^{-1}$ and integrated over this range.

The silica glass crucible 1 is preferably substantially free of micro-cracking on the inner surface thereof. The term "substantially free of micro-cracking" as used herein is meant to indicate that there are produced no visual white patterns even after 5 hours or longer of immersion in hydrofluoric acid (HF) having a concentration of from 15% to 17%.

Such a preferred embodiment has the following grounds.

As a method for inhibiting the expansion of bubbles in the silica glass crucible, i.e., volumetric expansion of the silica glass crucible there has heretofore been practiced a method which comprises subjecting a silica glass crucible formed by arc fusion (which has been allowed to cool to room temperature) to heat treatment at a temperature of from 300° C. to 1,200° C. in a hydrogen atmosphere (JP-A-5-24889). According to the inventor's experiment, it was confirmed that this method certainly gives solution to the problem of expansion of bubbles in the silica glass crucible but is subject to considerable partial erosion of the inner surface of the silica glass crucible during the withdrawal of single crystal resulting in the drop of the percent conversion to single crystal. It is presumed that the partial erosion of the inner surface of the silica glass crucible involves the following phenomenon. In other words, when the silica glass crucible which has once been cooled is subjected to heat treatment in the following hydrogen atmosphere, impurity-containing areas scattered on the inner surface of the silica glass crucible are eroded by hydrogen, causing numerous invisible micro-cracks to occur all over the inner surface of the silica glass crucible. It is thus presumed that when a single crystal is withdrawn from the silica glass crucible, erosion by molten Si begins selectively with the foregoing micro-cracks.

The foregoing micro-cracks cannot be confirmed even by a surface roughness meter or the like. However, the foregoing silica glass crucible can be visually observed for white patterns when the inner surface thereof is immersed in a hydrofluoric acid solution having a concentration of from 15% to 17% for 5 to 10 hours. On the contrary, the inventors found that when a single crystal is withdrawn from a silica glass crucible which shows no such patterns, i.e., silica glass crucible substantially free of micro-cracks on the inner surface thereof, no remarkable roughness occurs on the inner surface of the silica glass crucible during the withdrawal of single crystal unlike the conventional methods.

The process for the preparation of the silica glass crucible according to the present invention will be described hereinafter.

Figure 3:
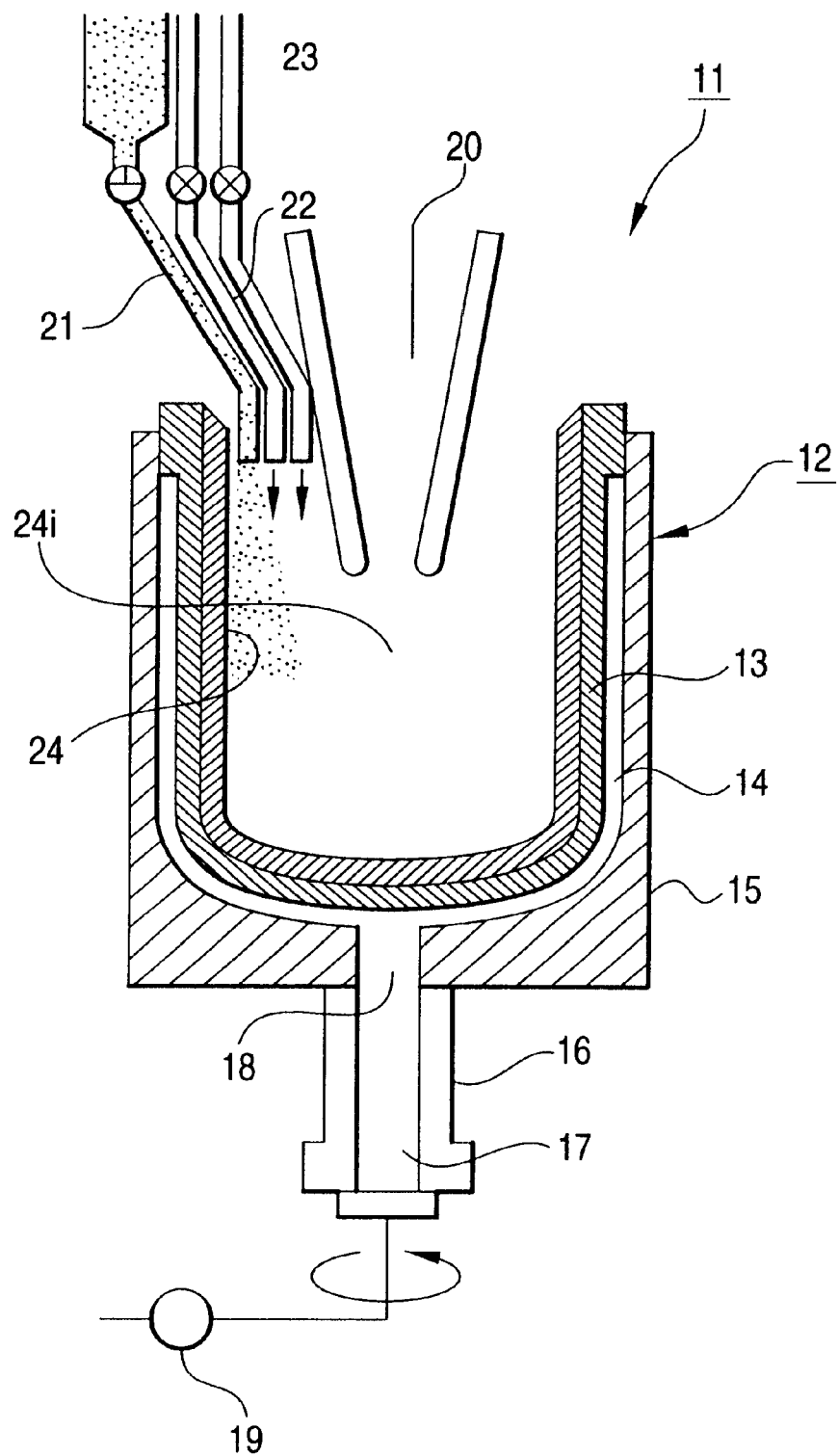
FIG. 3 is a diagram illustrating the process for the preparation of the silica glass crucible according to the present invention.

As shown in FIG. 3, a silica glass crucible preparing apparatus 11 has a crucible forming mold 12 comprising an inner member 13 formed by a gas-permeable member such as mold having a plurality of through-holes formed therein and highly purified porous carbon mold and a retainer 15 for retaining the inner member 13 with an air passage 14 provided interposed therebetween.

Fixed to the retainer 15 at the lower portion thereof is a rotating shaft 16 which is connected to a rotating means (not shown). The rotating shaft 16 rotatably supports the crucible forming mold 12. The air passage 14 is connected to an air outlet 18 provided at the center of the rotating shaft 16 via an opening provided at the lower portion of the retainer 15. The air passage 14 is finally connected to an evacuating mechanism 19.

Provided opposing the inner member 13 at the upper portion thereof are arc electrodes 20 for arc discharge, a starting material supplying nozzle 21, an inert gas supplying pipe 22 and a hydrogen gas supplying pipe 23.

Accordingly, in order to prepare a crucible using the foregoing silica glass crucible preparing apparatus 11, a rotary driving source (not shown) is operated to rotate the rotating shaft 16 in the direction indicated by the arrow, causing the crucible forming mold 12 to rotate at a predetermined speed. Into the crucible forming mold 12 at the upper portion thereof is supplied a high purity silica powder as a starting material through the starting material supplying nozzle 21. The silica powder thus supplied is pressed against the inner member 13 of the crucible forming mold 12 by centrifugal force to form a crucible-shaped molded product 24. As the foregoing silica powder there may be used a natural silica powder such as rock crystal powder or a synthetic silica powder as obtained by sol-gel method or the like, singly or in proper combination.

Figure 4:
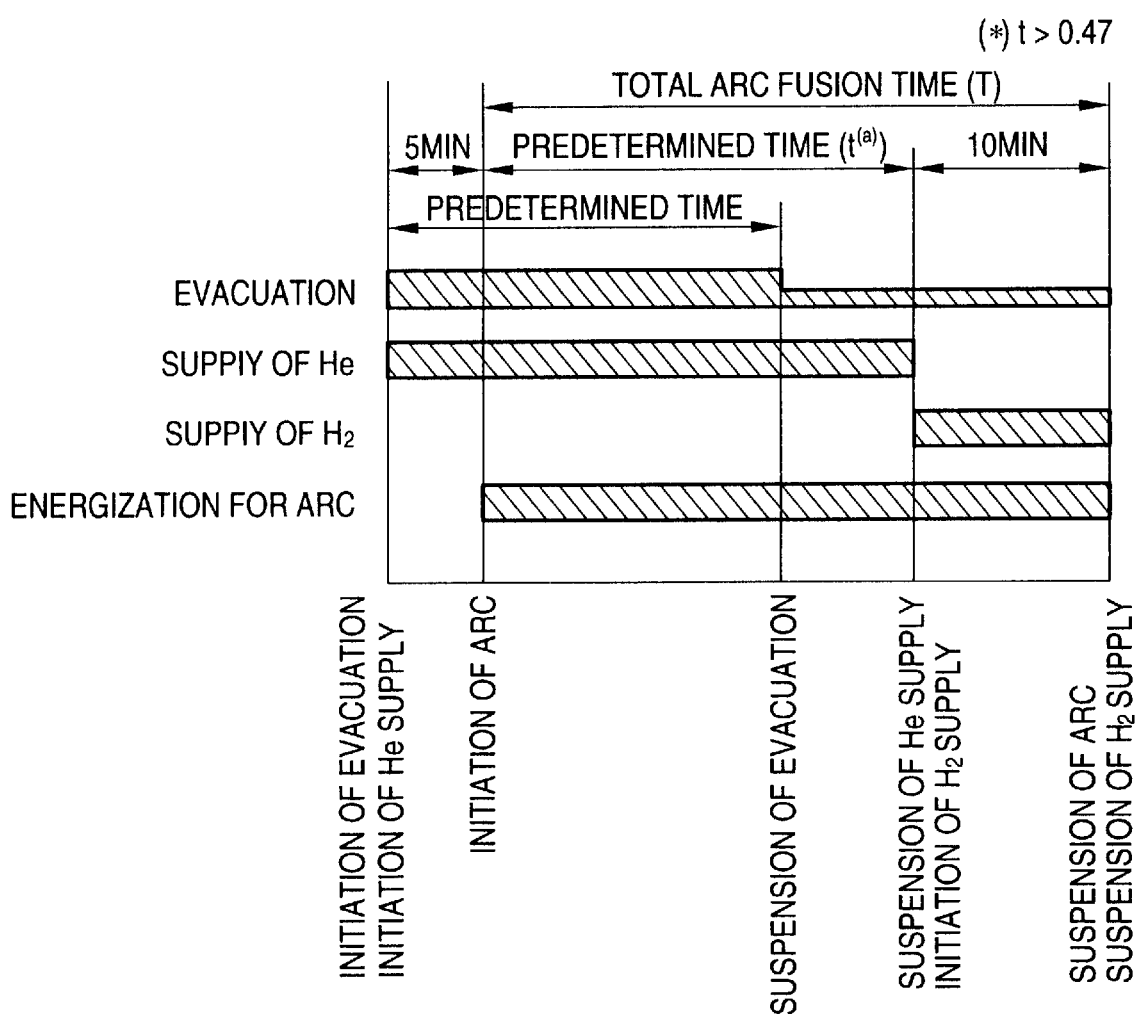
FIG. 4 is a flow chart for the preparation of the silica glass crucible according to the present invention.

Subsequently, the flow chart for preparation shown in FIG. 4 is followed. In some detail, the evacuating mechanism 19 is operated to evacuate the interior of the inner member 13. Helium gas or argon gas is supplied into the interior 24i of the molded product 24 at a constant rate, e.g., 80 l/min through the inert gas supplying pipe 22. After 5 minutes of supply of helium gas, the arc electrodes 20 are continuously energized to heat the molded product 24 internally, thereby forming a fused layer on the inner surface of the molded product 24.

After the elapse of a predetermined period of time, the evacuating mechanism 19 is then adjusted or suspended to adjust or suspend the evacuation of the interior of the crucible forming mold 12 in order to properly form an opaque layer containing numerous bubbles on the outer side of the crucible. With the evacuation being lessened or suspended, arc fusion is continued for the total arc fusion time (T minutes). After the elapse of a predetermined period of time from the initiation of arc fusion, the supply of helium gas is suspended. After the suspension of the supply of helium gas, the supply of hydrogen gas is initiated, e.g., at the same time with the suspension of the supply of helium gas. Hydrogen gas is supplied into the interior 24i of the molded product 24 at a constant rate of, e.g., 100 l/min through the hydrogen gas supplying pipe 23. The supply of hydrogen gas is initiated at latest 5 minutes, e.g., 10 minutes, before the suspension of arc fusion and after the elapse of t minutes corresponding to 40% of the total arc fusion time (T minutes) (t>0.4 T). After the elapse of a predetermined period of time T from the initiation of arc fusion, energization for arc fusion and the supply of hydrogen gas are suspended to terminate the crucible preparation process.

In accordance with the foregoing crucible preparation process, the supply of helium gas makes it possible to properly reduce the amount of bubbles in the opaque layer provided on the outer side of the silica glass crucible. Further, the supply of helium gas and the supply of hydrogen gas during the latter half of the preparation step make it possible to drastically reduce the amount of bubbles in the transparent layer. Moreover, the expansion of bubbles left in the transparent layer and bubbles in the opaque layer during the withdrawal of single crystal can be prevented.

Further, the vacuum fusion makes it possible to reduce the amount of bubbles left in the transparent layer. Moreover, the adjustment of the degree of vacuum makes it possible to control the amount and diameter of bubbles in the opaque layer. The vacuum fusion is preferably effected before or at the same time with the initiation of arc fusion or after the inner surface of the crucible-shaped molded product has been fused by arc fusion to a thickness of, e.g., 100 $\mu$m to obtain the former effect. Further, the reduction or suspension of the evacuation during arc fusion makes it possible to control the amount of bubbles in the opaque layer more properly.

Further, since the supply of hydrogen gas is initiated 5 minutes before the suspension of arc fusion, the effect of the supply of hydrogen can be sufficiently exerted, making it possible to reduce the amount of bubbles left in the transparent layer provided on the inner side of the crucible and prevent the expansion of bubbles in the opaque layer provided on the outer side of the crucible.

Moreover, since the supply of hydrogen gas is initiated after the elapse of time t corresponding to 40% of the total arc fusion time T, the high temperature viscosity of silica glass constituting the crucible cannot be deteriorated, making it possible to obtain a silica glass crucible which can be used over an extended period of time.

When the supply of hydrogen gas is initiated before the elapse of time t corresponding to 40% of the total arc fusion time T, there are more areas containing OH group in silica glass in a high concentration, deteriorating the high temperature viscosity of the entire crucible. The resulting crucible undergoes deformation during the withdrawal of single crystal and thus cannot be used over an extended period of time.

Figure 5:
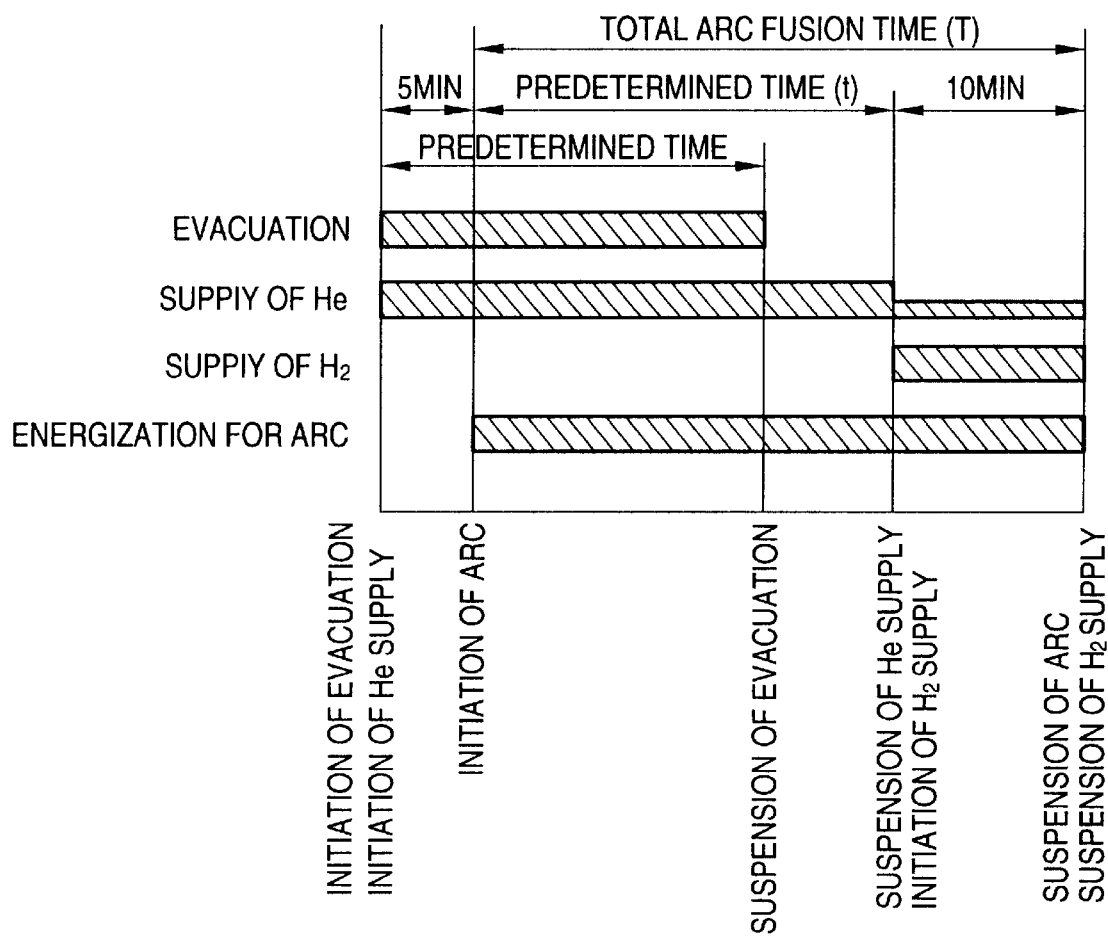
FIG. 5 is another flow chart for the preparation of the silica glass crucible according to the present invention.

In the foregoing embodiment, the supply of hydrogen gas is initiated at the same time with the suspension of the supply of helium gas. As shown in FIG. 5, however, the supply of helium gas may be continued with the rate being reduced from 80 l/min to 10 l/min instead of being suspended. The supply of hydrogen gas may be initiated at the same time with the reduction of the supply rate.

Further, the supply of hydrogen gas may not be initiated at the same time with the suspension of helium gas. Even when the supply of hydrogen gas is initiated after the elapse of a predetermined period of time from the suspension of the supply of helium gas so far as it is short enough, the effect of the present invention can be expected.

Figure 6:
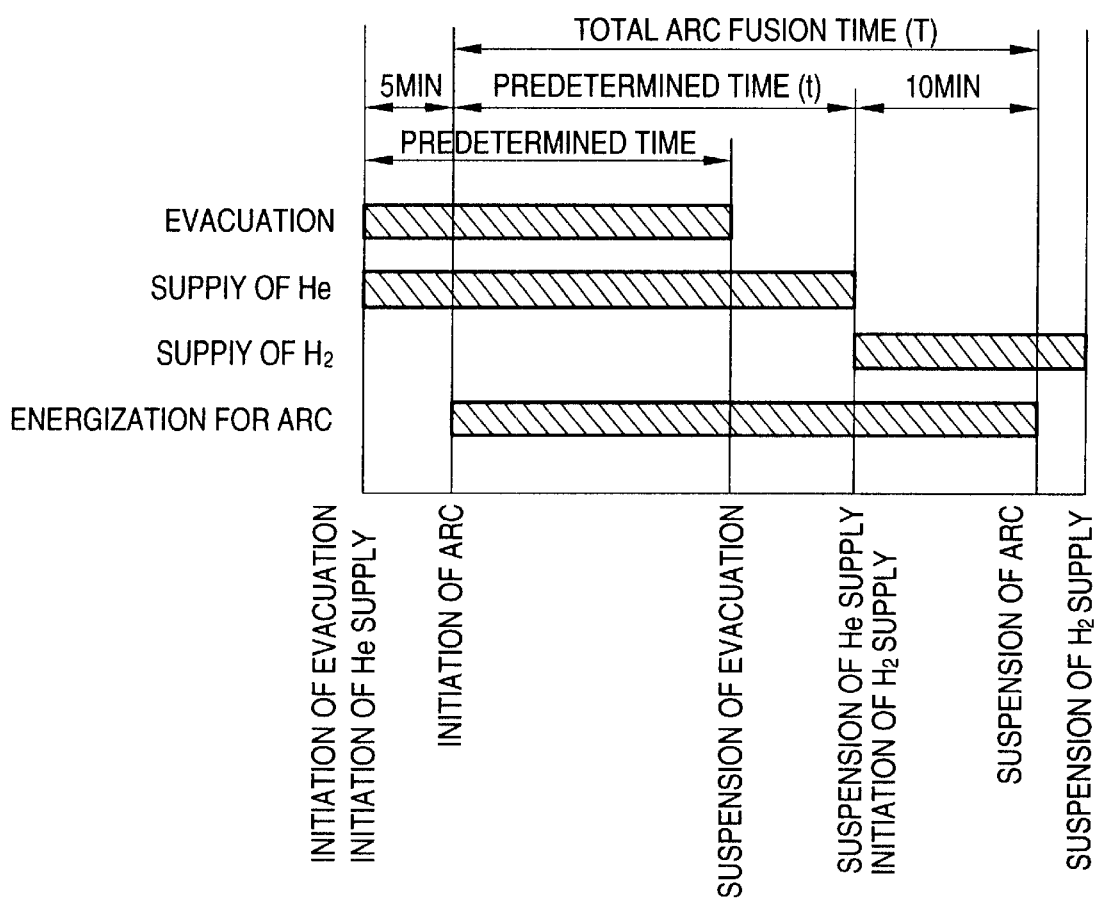
FIG. 6 is still another flow chart for the preparation of the silica glass crucible according to the present invention.

Further, as shown in FIG. 6, the supply of hydrogen gas may be continued until the crucible is allowed to cool to 800° C. after the suspension of energization for arc fusion.

In other words, the process for the preparation of the silica glass crucible for withdrawing a single silicon crystal according to the present invention involves arc fusion with helium gas or argon gas being supplied, the supply of helium or argon gas being suspended or lessened after the elapse of a predetermined period of time from the initiation of arc fusion, accompanied by the initiation of the supply of hydrogen gas, the initiation and time of which are regulated.

Accordingly, the synergistic effect of helium gas or argon gas and hydrogen gas causes the reduction of bubbles left in the transparent layer and prevents the expansion of bubbles left in the transparent layer, making it possible to prevent bubbles from entering into the silicon melt during the withdrawal of single silicon crystal and hence prevent the occurrence of dislocation in the single silicon crystal due to crystal dislocation. Thus, a high percent conversion to single crystal can be obtained. As a result, a silica glass crucible for withdrawing a single silicon crystal having a high viscosity which undergoes no deformation even after prolonged use can be obtained even in a large size.

EXAMPLE

Silica glass crucibles were prepared. The silica glass crucibles thus prepared were then examined for characteristics. Using these silica glass crucibles, actual tests for the withdrawal of single silicon crystal were conducted. Thus, the various silica glass crucibles were comprehensively evaluated.

[1] Preparation of Silica Glass Crucible

Example 1

A crucible mold having an outer diameter of 560 mm and a height of 500 mm was loaded with a starting material having an average particle diameter of 230 µm prepared by grinding natural rock crystal and purifying the material to a deposit thickness of 25 mm. Helium gas was then supplied into the interior of the molded product at a rate of 80 l/min while evacuating externally the crucible mold thus loaded to a fusion pressure of 300 Torr using a vacuum pump. When 5 minutes passed after the initiation of the supply of helium gas, the arc electrodes were then continuously energized to heat internally the molded product for 60 minutes in total. When 15 minutes passed after the initiation of arc fusion, the fusion pressure was reduced to 700 Torr. When 50 minutes passed after the elapse of about 83% of the total arc fusion time (60 minutes), the supply of helium gas was suspended. At the same time, hydrogen gas was supplied into the interior of the molded product at a rate of 100 l/min.

Thereafter, the arc fusion and the supply of hydrogen gas were continued. When 10 minutes passed after the initiation of the supply of hydrogen gas, the arc fusion and the supply of hydrogen gas were suspended at the same time to terminate the crucible preparing process, thereby obtaining a silica glass crucible.

[2] Examination of Characteristics of Silica Glass Cucible
(1) Conditions for the Preparation of Silica Glass Crucible Sample Example 1

Silica glass crucible prepared by the preparation process described in Clause [1] (natural silica material was used; deposit thickness: 25 mm)

Example 2

Silica glass crucible prepared in the same manner as described in Clause [1] except that the following materials were used. (Outer side: natural silica material was used (deposit thickness: 17 mm); inner surface side: synthetic silica was used (deposit thickness: 8 mm))

Comparative Example 1

Silica glass crucible prepared from natural silica material alone in the same manner as in Example 1 except that hydrogen gas had been supplied onto the inner surface of the powder molded product between before the initiation of arc fusion and the suspension of arc fusion.

Comparative Example 2

Silica glass crucible prepared from natural silica material and synthetic silica material similarly to Example 2 but in the same manner as in Comparative Example 1.

Conventional Example 1

Silica glass crucible prepared from natural silica material alone in the same manner as in Example 1 except that arc fusion was effected in the atmosphere.

Conventional Example 2

Silica glass crucible prepared from natural silica material for outer layer and synthetic silica material for inner layer in the same manner as in Example 2 except that arc fusion was effected in the atmosphere.

(2) Measurement of Fluorescence Intensity

A columnar specimen was cut out of the silica glass crucible (Example 1) prepared by the preparation process described in Clause (1). The specimen was mirror-polished, and then subjected to laser Raman spectroscopy. In some detail, the specimen was perpendicularly irradiated on the side face thereof with Ar laser beam of 514 nm at a power of 400 mW. The resulting Raman scattering and fluorescence were measured at the front face of the specimen. The Raman scattering and fluorescence were subjected to spectroscopic analysis using a Zernitana type spectroscope having a resolution of 1 cm$^{-1}$ or less. The fluorescence intensity was then detected by means of CCD which had been cooled with liquefied nitrogen.

Figure 7:
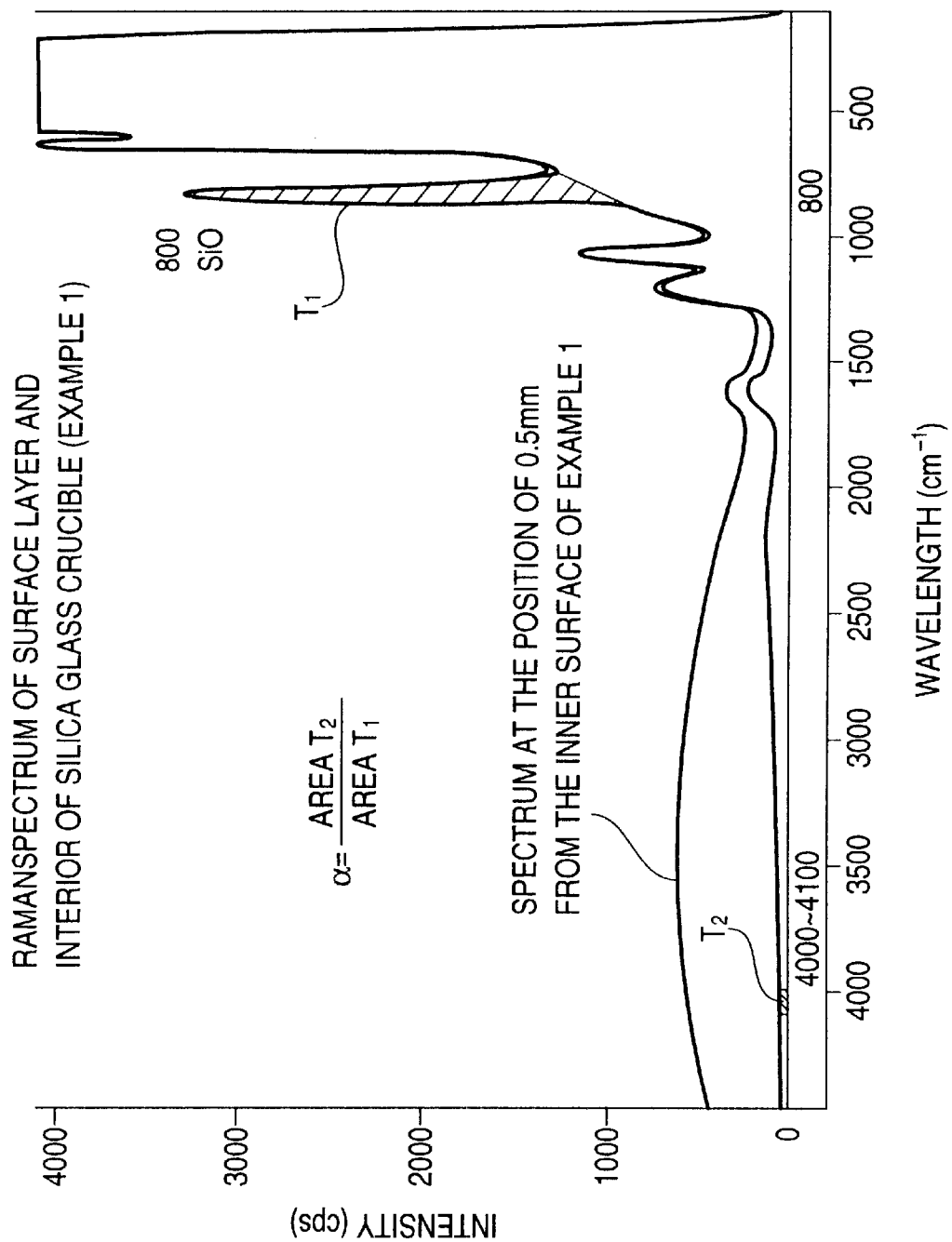
FIG. 7 illustrates the Raman spectrum of a silica glass crucible (Example 1) prepared by the process for the preparation of the silica glass crucible according to the present invention.
Figure 8:
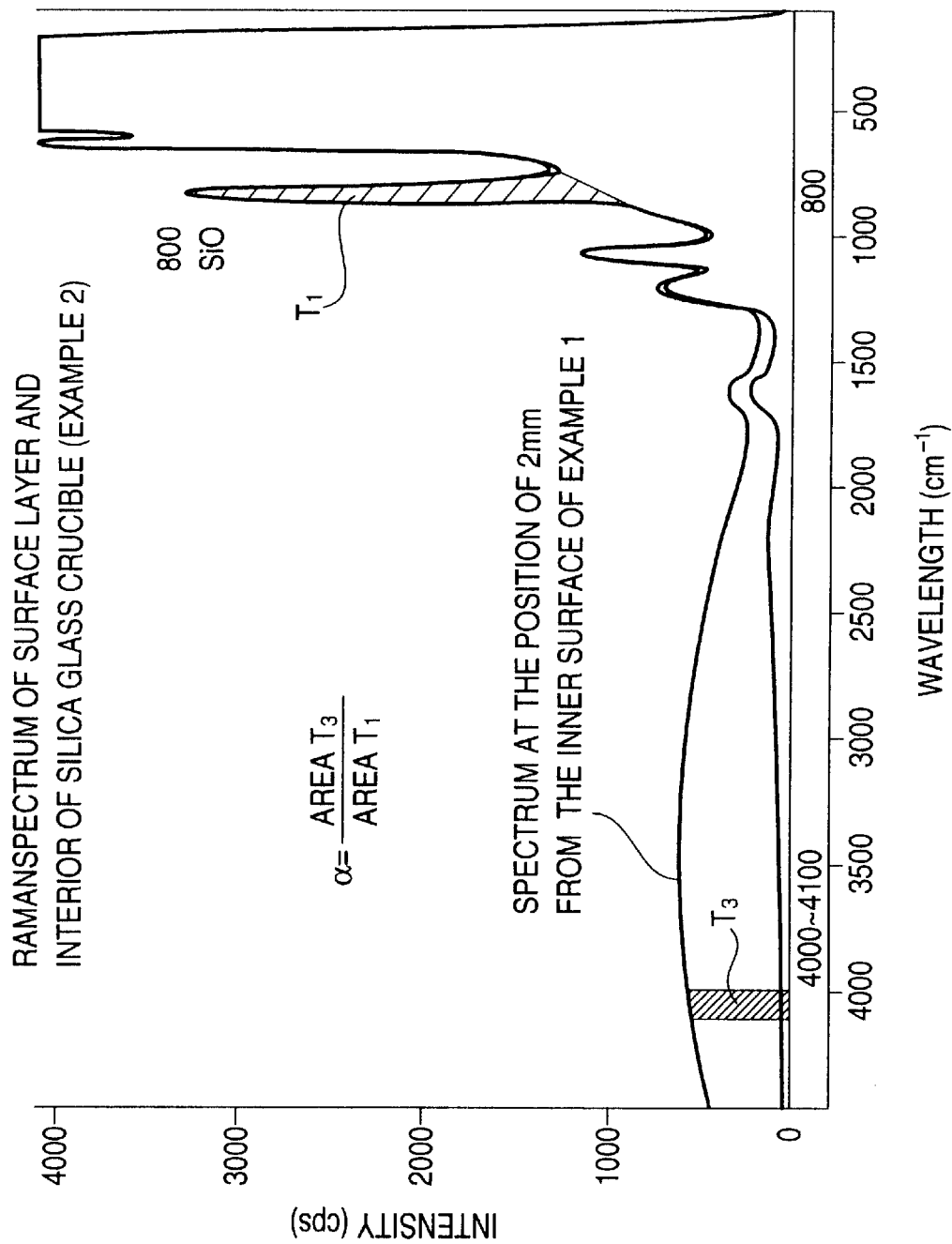
FIG. 8 illustrates the Raman spectrum of another silica glass crucible (Example 2) prepared by the process for the preparation of the silica glass crucible according to the present invention.

FIG. 7 indicates the spectrum of the specimen of Example 1 at a thickness of 0.5 mm from the inner surface thereof. FIG. 8 indicates the spectrum of the specimen of Example 1 at a thickness of 2 mm from the inner surface thereof.

It was confirmed that high red fluorescence developed by dissolved oxygen appears in the transparent layer. As described in FIGS. 7 and 8, the value of a obtained by dividing the fluorescent intensity integrated over a wavelength range of 4,000 cm$^{-1}$ and 4,100 cm$^{-1}$ by the fluorescent intensity integrated at a wavelength of 800 cm$^{-1}$ where an SiO peak appears as determined by subjecting a section of the thickness of the silica glass crucible to laser Raman spectroscopy involving excitation by laser beam of 514 nm is T2/T1 or T3/T1, which is called fluorescence intensity.

(3) Measurement of Change in Fluorescence Intensity

A columnar specimen was cut out of the various silica glass crucibles (Examples 1 and 2, Comparative Examples 1 and 2, Conventional Examples 1 and 2) prepared under the preparation conditions described in Clause (1), mirror-polished, and then examined for change in the fluorescence intensity of the section of the transparent layer by the foregoing laser Raman spectroscopy. The results of measurement are set forth in FIGS. 9 to 14.

Figure 9:
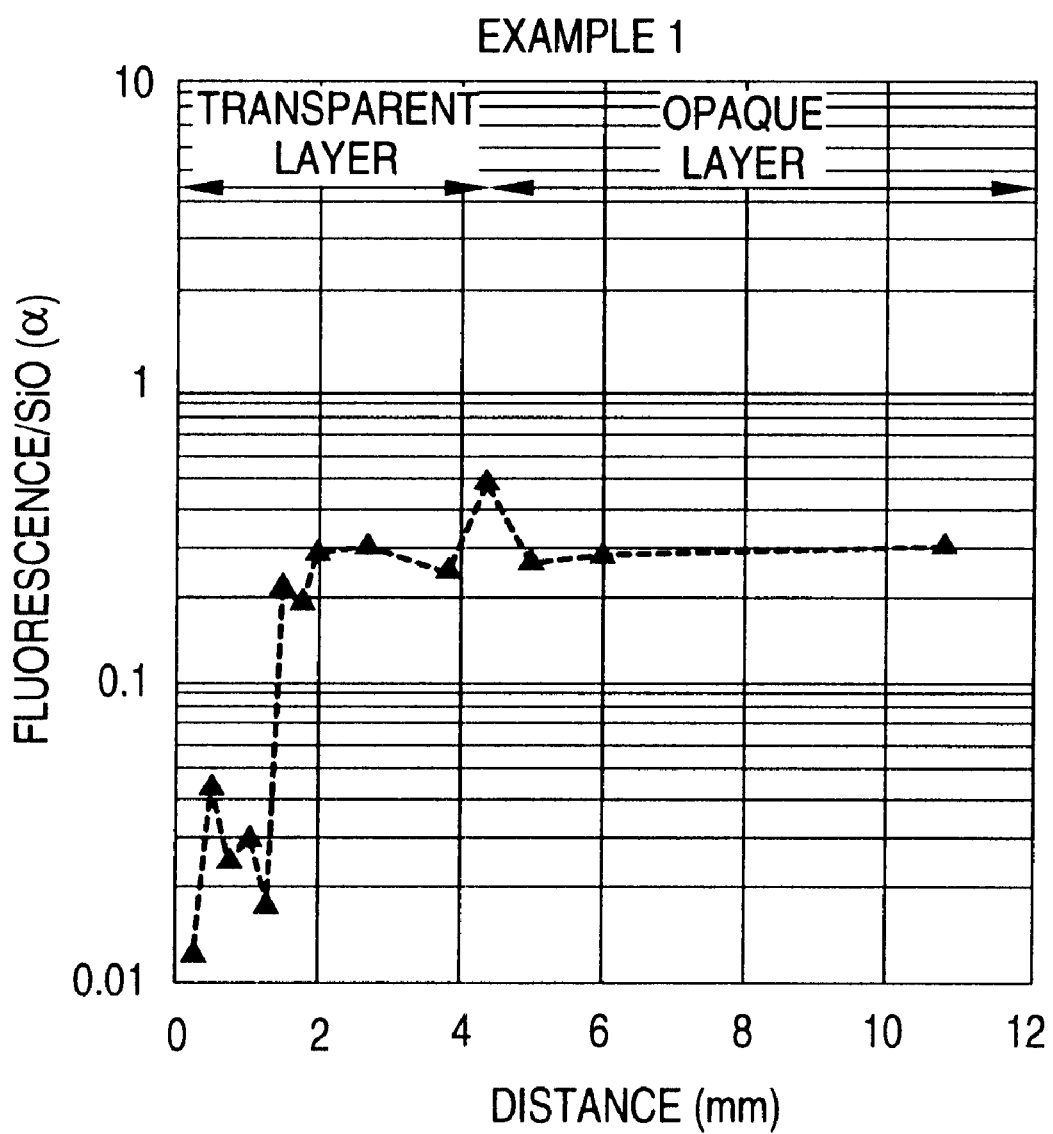
FIG. 9 illustrates the measurements of fluorescence intensity of the transparent section of the silica glass crucible (Example 1) prepared by the process for the preparation of the silica glass crucible according to the present invention.
Figure 10:
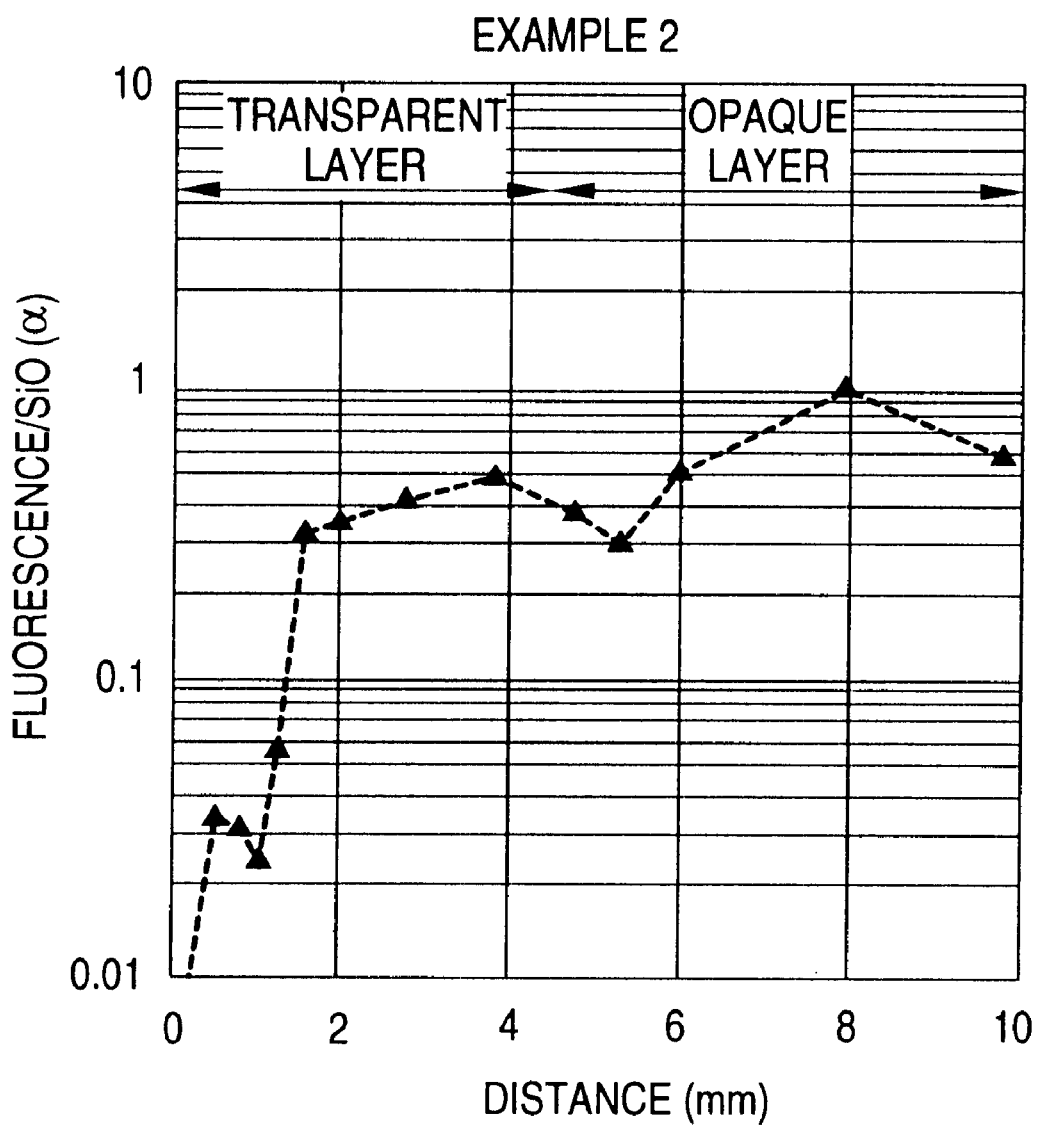
FIG. 10 illustrates the measurements of fluorescence intensity of the transparent section of the silica glass crucible (Example 2) prepared by the process for the preparation of the silica glass crucible according to the present invention.

As shown in FIGS. 9 and 10, Examples 1 and 2 each involve the formation of a transparent layer in helium gas followed by heating the surface layer of the crucible in hydrogen and thus show a fluorescence intensity decrease to 0.05 or less over a thickness of 1.2 mm and 1.0 mm from the surface of the transparent layer, respectively. This means that heating in hydrogen causes hydrogen to be diffused or dissolved in the glass surface layer, removing dissolved oxygen and unstable oxygen.

Figure 11:
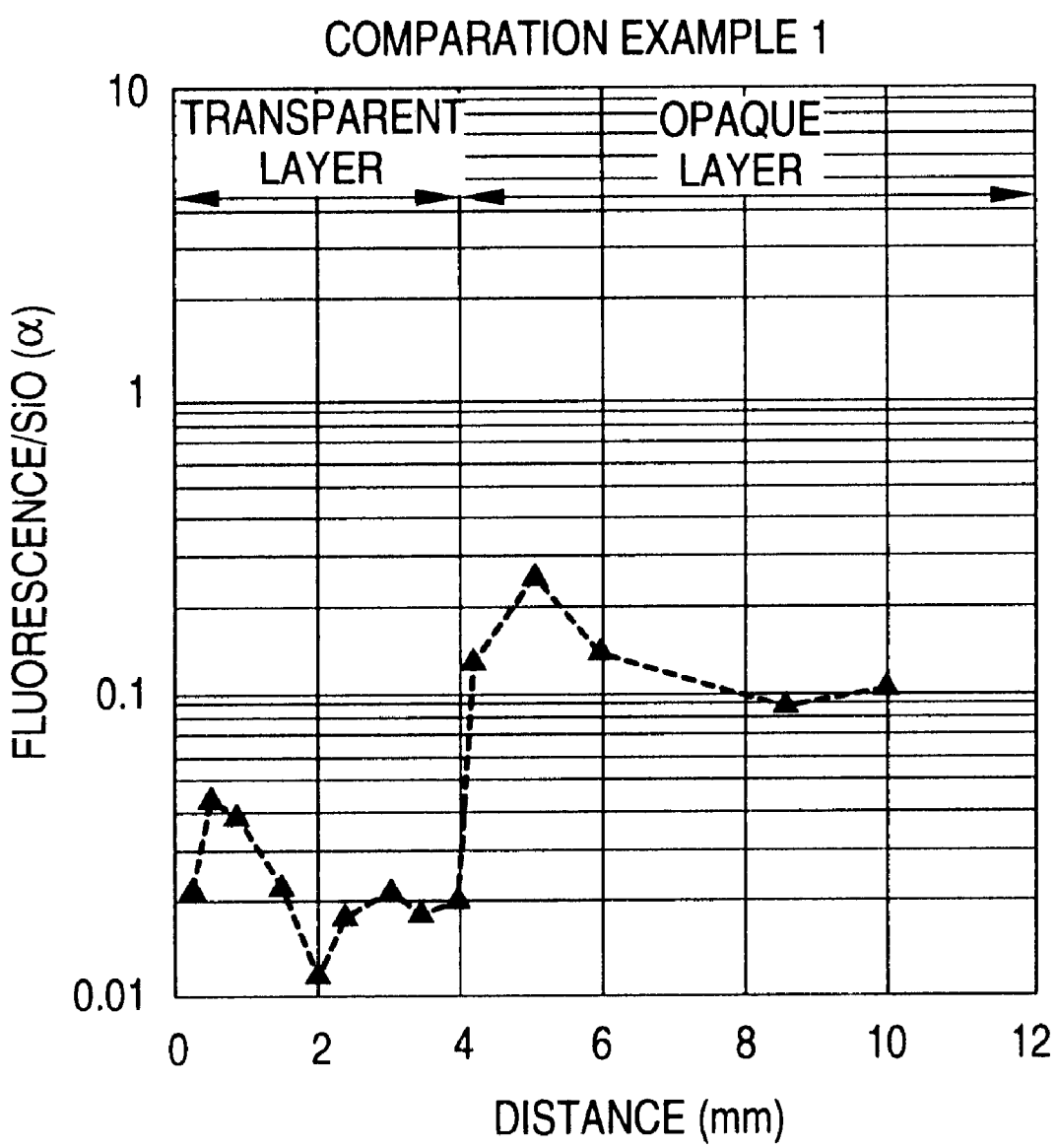
FIG. 11 illustrates the measurements of fluorescence intensity of the transparent section of a silica glass crucible (Comparative Example 1).
Figure 12:
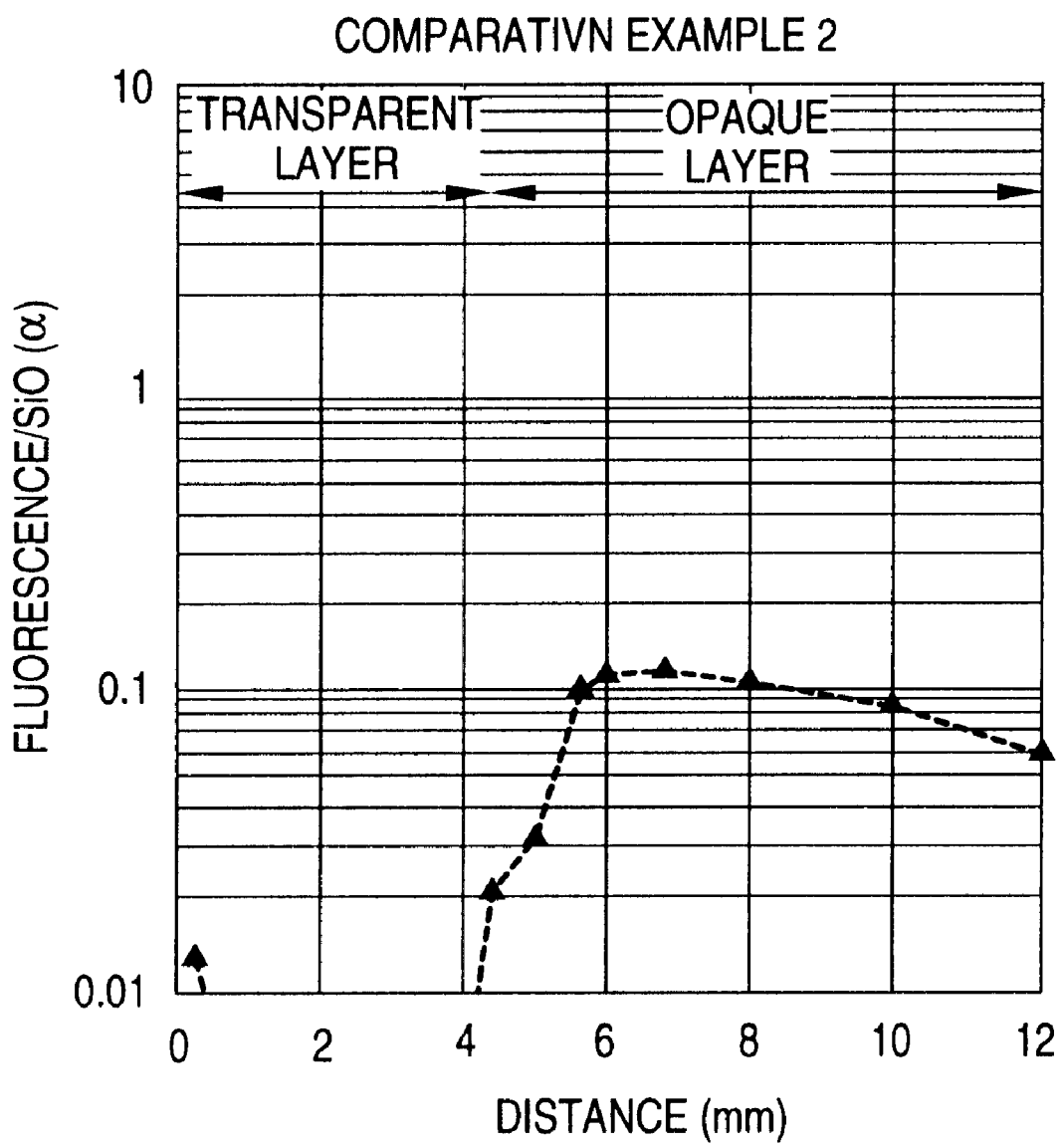
FIG. 12 illustrates the measurements of fluorescence intensity of the transparent section of a silica glass crucible (Comparative Example 2).

As shown in FIGS. 11 and 12, Comparative Examples 1 and 2 each involve the formation of a transparent layer in a hydrogen atmosphere and thus show a fluorescence intensity decrease to 0.05 or less over a thickness of 4.0 mm and 4.3 mm from the surface of the transparent layer, respectively. This means that dissolved oxygen and unstable oxygen have been removed.

Figure 13:
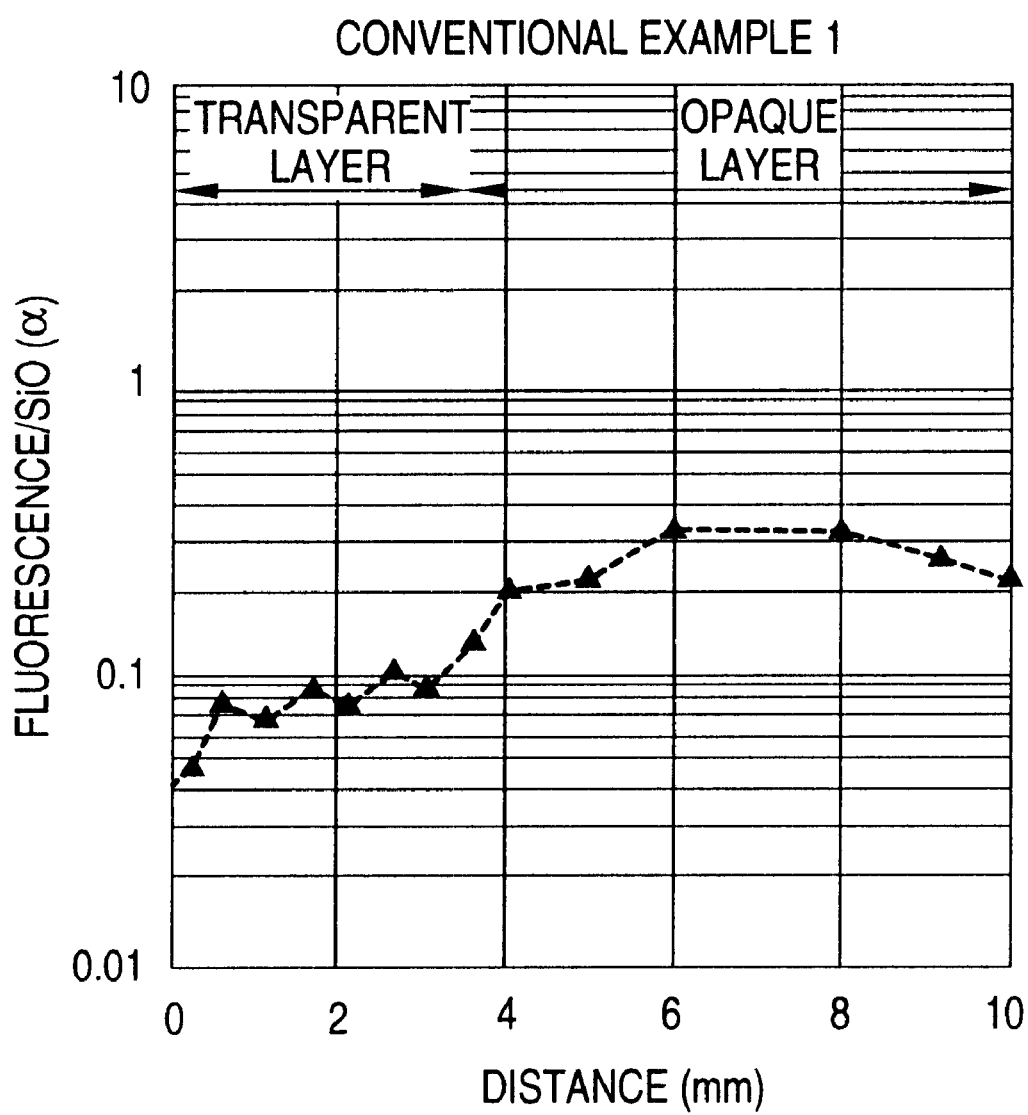
FIG. 13 illustrates the measurements of fluorescence intensity of the transparent section of a silica glass crucible (Conventional Example 1).
Figure 14:
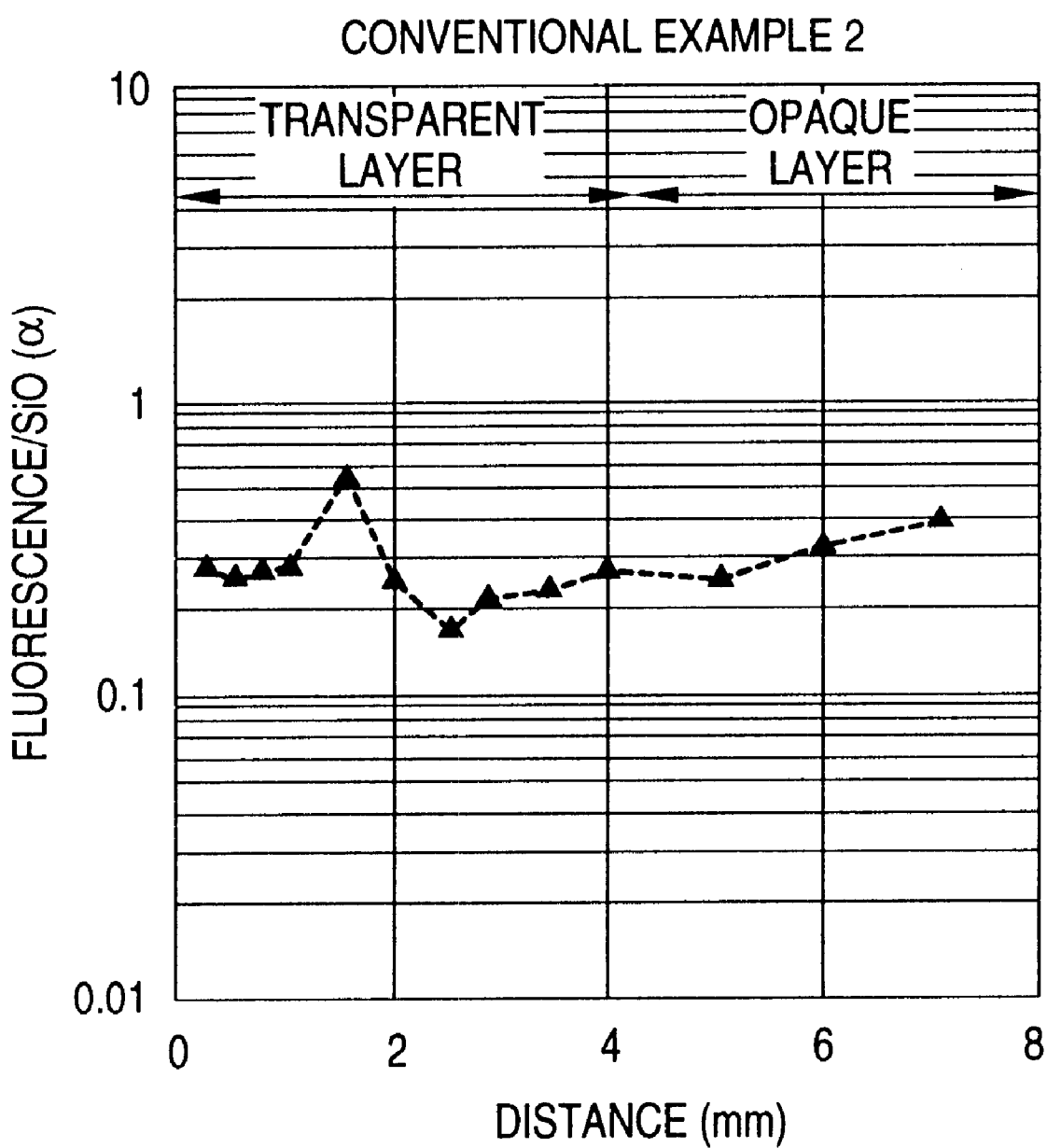
FIG. 14 illustrates the measurements of fluorescence intensity of the transparent section of a silica glass crucible (Conventional Example 2).

As shown in FIGS. 13 and 14, Conventional Examples 1 and 2 each involve the formation of a transparent layer in air. Thus, in Conventional Example 1, the fluorescence intensity is 0.05 or less over a thickness of 0.2 mm from the surface of the transparent layer and more than 0.05 over a thickness outside the point of 0.5 mm from the surface of the transparent layer. In Conventional Example 2, the fluorescence intensity is more than 0.05 over the entire thickness of the transparent layer. This means that dissolved oxygen and unstable oxygen have been left in the transparent layer.

(4) Measurement of OH Group Concentration

A columnar specimen was cut out of the various silica glass crucibles (Examples 1 and 2, Comparative Examples 1 and 2, Conventional Examples 1 and 2) prepared under the preparation conditions described in Clause [2] (1) in the same manner as described in Clause (1), and then measured for OH group concentration in the vertical direction by infrared spectroscopy. The results of measurement are set forthin FIGS. 15 and 16.

Figure 15:
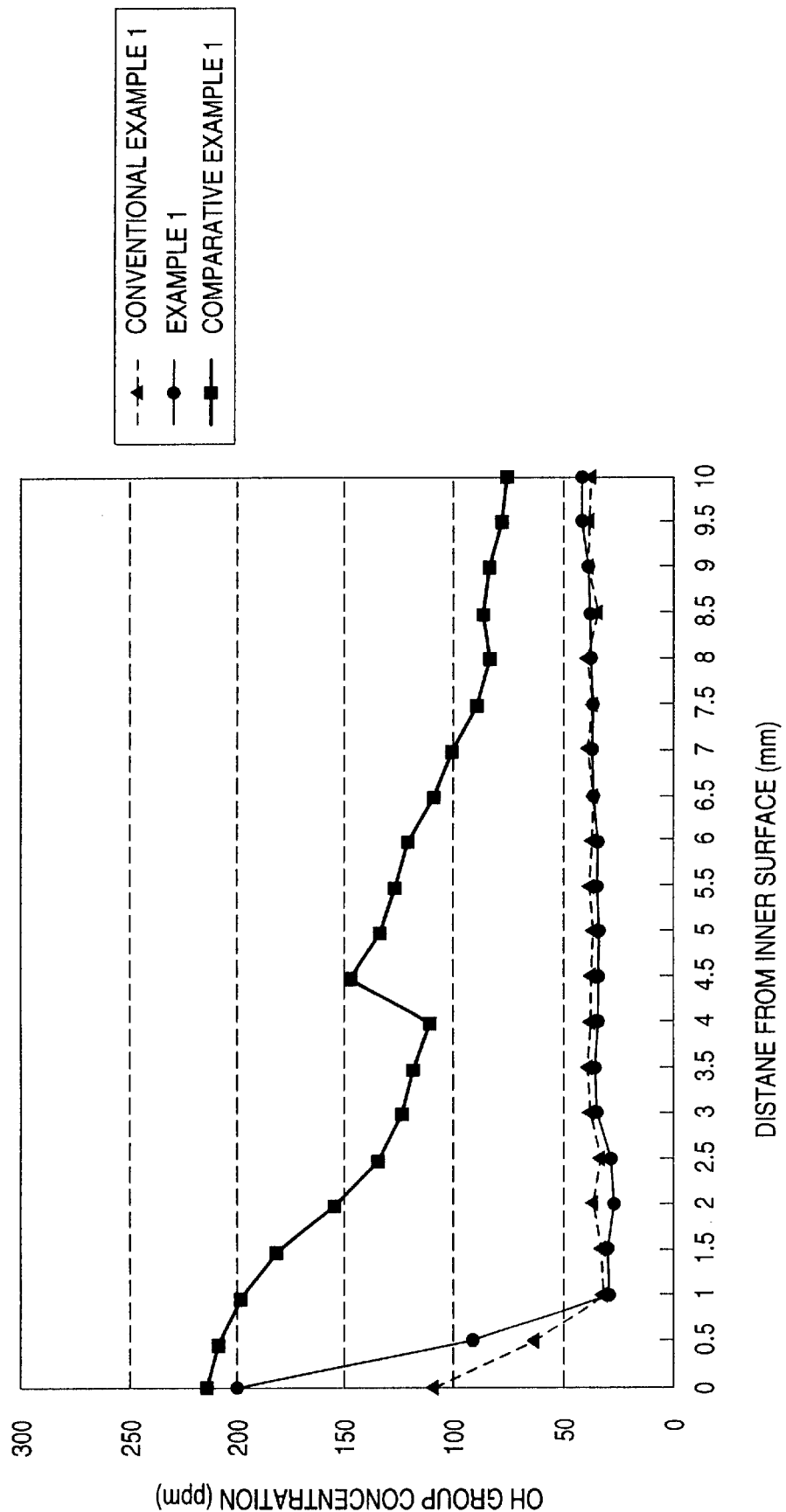
FIG. 15 illustrates the distribution of OH group concentration over the thickness of natural silica glass crucibles prepared by the process for the preparation of silica glass crucible according to the present invention and silica glass crucibles of comparative examples and conventional examples.

As shown in FIG. 15, Example 1 shows an OH group concentration distribution ranging from 30 ppm to 43 ppm over a thickness outside the point of at least 1.0 mm from the inner surface of the silica glass crucible and shows an OH group concentration of 50 ppm or less all over this thickness range.

Figure 16:
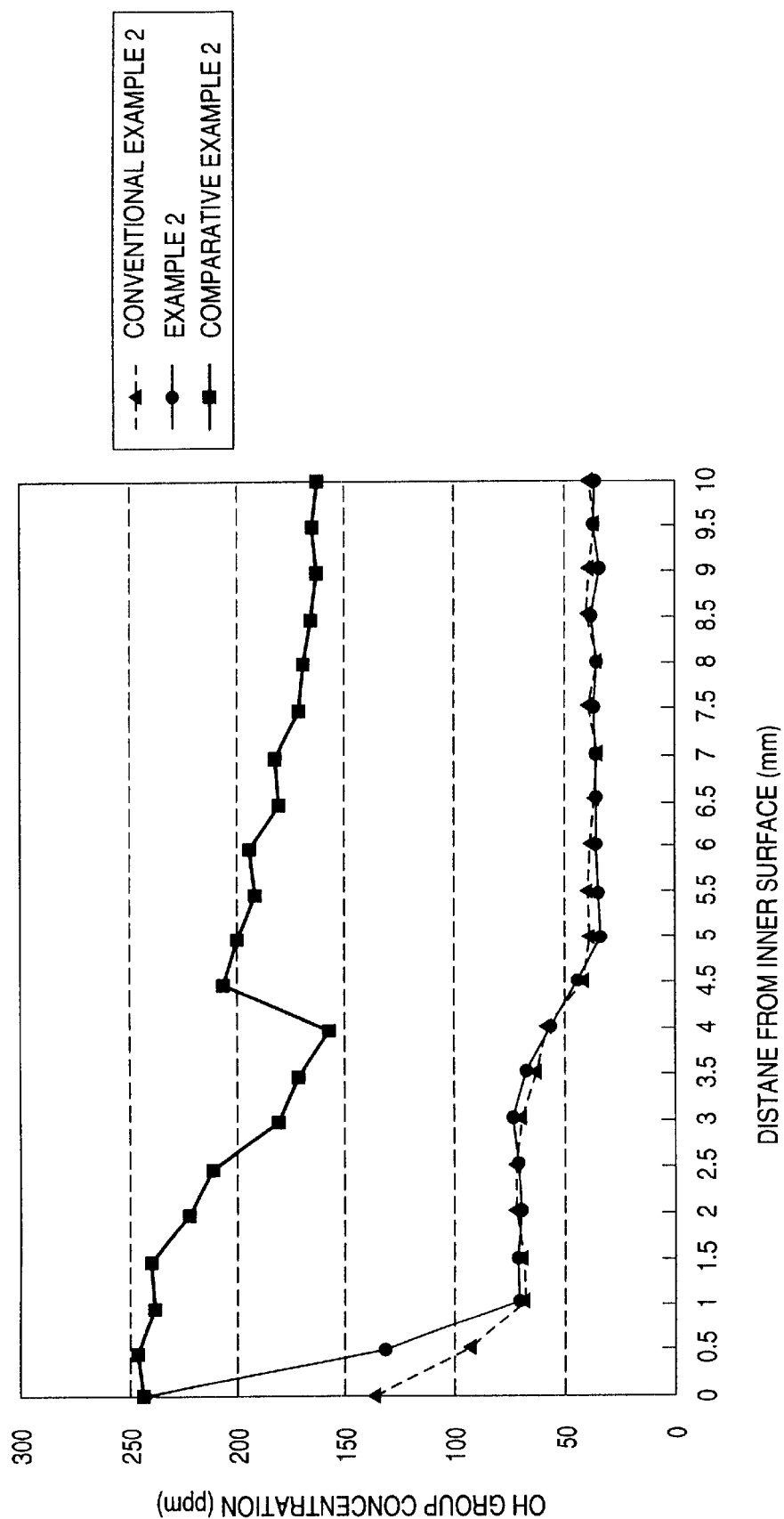
FIG. 16 illustrates the distribution of OH group concentration over the thickness of synthetic silica glass crucibles prepared by the process for the preparation of silica glass crucible according to the present invention and silica glass crucibles of comparative examples and conventional examples.

As shown in FIG. 16, Example 2 shows an OH group concentration distribution ranging from 32 ppm to 71 ppm over a thickness outside the point of at least 1.0 mm from the inner surface of the silica glass crucible and shows an OH group concentration of 100 ppm or less over a thickness outside the point of 7.5 mm from the inner surface of the silica glass crucible.

As shown in FIG. 15, Comparative Example 1 shows an OH group concentration distribution ranging from 69 ppm to 208 ppm over the total thickness from the inner surface of the silica glass crucible to the outer surface of the silica glass crucible and shows an OH group concentration of 100 ppm or less over a thickness outside the point of at least 7.5 mm from the inner surface of the silica glass crucible. As shown in FIG. 16, Comparative Example 16 shows an OH group concentration distribution ranging from 185 ppm to 246 ppm over the total thickness from the inner surface of the silica glass crucible to the outer surface of the silica glass crucible and shows an OH group concentration of more than 100 ppm over the total thickness of the silica glass crucible.

As shown in FIGS. 15 and 16, Conventional Examples 1 and 2 show almost the same OH group concentration contribution as that of Examples 1 and 2, respectively.

[3] Actual Withdrawal Test

A single crystal having a diameter of 200 mm was withdrawn 10 times each from the various silica glass crucibles prepared under the preparation conditions described in Clause [2] (1) in the same manner as described in Clause [1] which had been loaded with 100 kg of polysilicon. The following results were obtained.

Example 1

Any section of the silica glass crucible thus used showed neither expansion of bubbles in the transparent layer nor deformation of the silica glass crucible. The resulting average percent conversion to single crystal was 97%.

Example 2

Any section of the silica glass crucible thus used showed neither expansion of bubbles in the transparent layer nor deformation of the silica glass crucible. The resulting average percent conversion to single crystal was 99%.

Comparative Example 1

Any section of the silica glass crucible thus used showed no expansion of bubbles in the transparent layer. However, the silica glass crucible was observed generally deformed. In some sections, the peripheral straight portion was observed inwardly inclined. The resulting average conversion to single crystal was 89%.

Comparative Example 2

Any section of the silica glass crucible thus used showed no expansion of bubbles in the transparent layer. However, the silica glass crucible was observed generally deformed. In some sections, the peripheral straight portion was observed inwardly inclined. The resulting average conversion to single crystal was 92%.

Conventional Example 1

Any section of the silica glass crucible thus used showed no general deformation of the transparent layer. However, numerous considerably large bubbles were observed, and some expansion of bubbles were observed. The resulting average conversion to single crystal was 85%.

Conventional Example 2

Any section of the silica glass crucible thus used showed no general deformation of the transparent layer. However, numerous considerably large bubbles were observed, and some expansion of bubbles were observed. The resulting average conversion to single crystal was 87%.

For the evaluation of expansion of bubbles, the transparent layer in the section of the silica glass crucible thus used was observed as compared with that of the unused silica glass crucible.

The silica glass crucible for withdrawing a single silicon crystal according to the present invention has little bubbles left in the transparent layer. Further, the expansion of bubbles left in the transparent layer can be inhibited, making it possible to prevent the bubbles in the transparent layer from entering into the molded silicon during the withdrawal of a single silicon crystal. In this arrangement, the single silicon crystal thus withdrawn from the silica glass crucible undergoes no dislocation due to crystal dislocation. As a result, a high conversion to single crystal can be obtained. Further, the silica glass crucible for withdrawing a single silicon crystal according to the present invention undergoes no deformation even after prolonged used. The silica glass crucible according to the present invention can also be prepared even in a large size.

In some detail, the value of a obtained by dividing the fluorescent intensity integrated over a wavelength range of 4,000 cm$^{-1}$ and 4,100 cm$^{-1}$ by the fluorescent intensity integrated at a wavelength of 800 cm$^{-1}$ where an SiO peak appears as determined by subjecting a section of the thickness of the silica glass crucible to laser Raman spectroscopy involving excitation by laser beam of 514 nm is 0.05 or less over a thickness of 0.5 mm or more from the inner surface of the silica glass crucible, and the OH group concentration is 100 ppm or less over the entire periphery beyond a thickness of at least 1.0 mm from the inner surface of the silica glass crucible. In this arrangement, the silica glass crucible according to the present invention causes no production of bubbles during the withdrawal of single crystal and shows no deformation during or after use, making it possible to provide a high percent withdrawal of single crystal.

Further, the silica glass crucible is substantially free of micro-cracks on the inner surface thereof. Thus, no remarkable roughness occurs on the inner surface of the silica glass crucible during the withdrawal of single crystal, making it possible to provide a high percent withdrawal of single crystal.

In accordance with the process for the preparation of the silica glass crucible for withdrawing a single silicon crystal according to the present invention, the synergistic effect of helium gas or argon gas and hydrogen gas causes the reduction of bubbles left in the transparent layer and prevents the expansion of bubbles left in the transparent layer, making it possible to prevent bubbles from entering into the silicon melt during the withdrawal of single silicon crystal and hence prevent the occurrence of dislocation in the single silicon crystal thus withdrawn due to crystal dislocation. Thus, a high percent conversion to single crystal can be obtained. As a result, a silica glass crucible for withdrawing a single silicon crystal having a high viscosity which undergoes no deformation even after prolonged use can be obtained even in a large size. Further, since the amount of bubbles in the transparent layer on the inner side of the silica glass crucible can be reduced by controlling the supply of helium gas or argon gas and hydrogen gas into the interior of the crucible, a high yield in the production of crucible can be obtained.

In accordance with supplying the hydrogen gas after reducing the supply of helium gas or argon gas to 0, or suspending the supply of the helium gas or argon gas, the effect preventing from expansion of bubbles which is accompanied with the arc fusion in supplying a hydrogen gas, tends to be uniform on all of the inner surface. The reason of the tendency is not clear but appears as follows. In the case that by supplying a hydrogen gas after suspending the supply of helium gas or argon gas, gas phase gets to be uniform. Contrary that, in the case that supplying a hydrogen gas with the supply of helium gas or argon gas, the state that helium gas or argon gas is not uniformly come into a hydrogen gas is formed, therefore the effect is not so uniform. Moreover, since the reduction of pressure is effected on the peripheral side of the crucible-shaped molded product via the mold before or at the same time with arc fusion or after the fusion of the inner surface of the crucible-shaped molded product by arc fusion, the amount of bubbles left in the transparent layer can be reduced. Further, by adjusting the degree of vacuum makes it possible to control the amount and diameter of bubbles in the opaque layer.

Further, since the reduction of pressure is lessened or suspended before the initiation of the supply of hydrogen gas, the effect of supply of hydrogen can be sufficiently exerted, making it possible to reduce the amount of bubbles left in the transparent layer provided on the inner side of the crucible and prevent the expansion of bubbles in the opaque layer provided on the outer side of the crucible.

Moreover, since the supply of hydrogen gas is initiated at latest 5 minutes before the suspension of arc fusion, the effect of supply of hydrogen can be sufficiently exerted, making it possible to reduce the amount of bubbles left in the transparent layer provided on the inner side of the crucible and prevent the expansion of bubbles in the opaque layer provided on the outer side of the crucible.

Further, since the supply of hydrogen gas is initiated after the elapse of time corresponding to 40% of the total arc fusion time from the initiation of arc fusion, the high temperature viscosity of the silica glass constituting the crucible cannot be deteriorated, making it possible to obtain a silica glass crucible which can be used over an extended period of time.

What is claimed is:

1. A silica glass crucible having α of 0.05 or less over a thickness of 0.5 mm or more from the inner surface of said silica glass crucible, α being obtained by dividing the fluorescent intensity integrated over a wavelength range of 4,000 cm$^{-1}$ by the fluorescent intensity integrated at a wavelength of 800 cm$^{-1}$ where an SiO peak appears as determined by subjecting a section of the thickness of said silica glass crucible to laser Raman spectroscopy involving excitation by laser beam of 514 nm, and an OH group concentration of 100 ppm or less over the entire periphery beyond a thickness of at least 1.0 mm from the inner surface of said silica glass crucible.

2. The silica glass crucible according to claim 1, substantially free of micro-cracking on the inner surface thereof.

3. A method of fabricating a silica glass crucible for withdrawing single silicon crystal, comprising the steps of:
   forming a crucible-shaped molded product by supplying a quartz powder as a starting material into a rotating mold to form;
   making said crucible-shaped molded product ark-fusion with supplying helium gas or argon gas at least into the interior of said crucible-shaped molded product; and
   starting the supply of hydrogen gas with reducing the supply of helium gas or argon gas before the termination of which the supplied amount of argon gas is reduced.

4. The method of fabricating a silica glass crucible for withdrawing single silicon crystal according to claim 3, wherein the step of starting the supply of the hydrogen gas is conducted immediately after the reducing the amount of supply of the hydrogen gas to 0.

5. The method of fabricating a silica glass crucible for withdrawing single silicon crystal according to claim 3, wherein the step of making said crucible-shaped molded product ark-fusion has a step of effecting the reduction of pressure on the peripheral side of said crucible-shaped molded product via said mold before or at the same time with said arc fusion or after the fusion of the inner surface of said crucible-shaped molded product by said arc fusion.

6. The method of fabricating a silica glass crucible for withdrawing single silicon crystal according to claim 5, wherein the reduction of pressure is lessened or suspended before the initiation of the supply of hydrogen gas.

7. The method of fabricating a silica glass crucible for withdrawing single silicon crystal according to claim 5, wherein the supply of hydrogen gas is initiated at latest 5 minutes before the termination of arc fusion.

8. The method of fabricating a silica glass crucible for withdrawing single silicon crystal according to claim 7, wherein the supply of hydrogen gas is initiated after the elapse of time corresponding to 40% of the total arc fusion time from the initiation of arc fusion.

9. A silica glass crucible produced by a process comprising:
   forming a crucible-shaped molded product by supplying a quartz powder into a rotating mold;
   supplying helium gas or argon gas at least into an interior of said crucible-shaped molded product;
   after said supplying, arc fusing said crucible-shaped molded product;
   during said arc fusing, reducing or terminating said supply of helium or argon gas and initiating a supply of hydrogen gas.

10. A silica glass crucible according to claim 9, wherein the process for producing the silica glass crucible further comprises initiating the supply of hydrogen gas at least 5 minutes before the suspension of arc fusion.

11. A silica glass crucible according to claim 9, wherein the process for producing the silica glass crucible further comprises initiating the supply of hydrogen gas after 40% of a total amount of time for the arc fusion has elapsed.

12. A silica glass crucible according to claim 9, wherein the inner surface of the silica glass crucible is substantially free of micro-cracking.

13. A silica glass crucible according to claim 9, comprising an OH group concentration of 100 ppm or less over the entire periphery beyond a thickness of at least 1.0 mm from the inner surface of the silica glass crucible.

14. A silica glass crucible according to claim 9, comprising an $\alpha$ of 0.05 or less over a thickness of 0.5 mm or more from the inner surface the silica glass crucible, wherein the value for $\alpha$ is obtained by dividing the fluorescent intensity integrated over a wavelength range of 4000 $cm^{-1}$ and 4100 $cm^{-1}$ by the fluorescent intensity integrated at a wavelength of 800 $cm^{-1}$ where an SiO peak appears as determined by subjecting a section of the thickness of the silica glass crucible to laser Ramen spectroscopy involving excitation by laser beam of 514 nm.

* * * * *